United States Patent
Hayashi et al.

(10) Patent No.: US 9,166,542 B2
(45) Date of Patent: Oct. 20, 2015

(54) HIGH FREQUENCY MODULE AND PORTABLE TERMINAL USING SAME

(71) Applicant: Murata Manufacturing Co., Ltd., Kyoto (JP)

(72) Inventors: Norio Hayashi, Kyoto (JP); Satoshi Shimizu, Kyoto (JP); Ryo Kadoi, Kyoto (JP); Akio Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/366,744

(22) PCT Filed: Dec. 5, 2012

(86) PCT No.: PCT/JP2012/081536
§ 371 (c)(1),
(2) Date: Jun. 19, 2014

(87) PCT Pub. No.: WO2013/094416
PCT Pub. Date: Jun. 27, 2013

(65) Prior Publication Data
US 2014/0354360 A1 Dec. 4, 2014

(30) Foreign Application Priority Data
Dec. 22, 2011 (JP) ................. 2011-280827

(51) Int. Cl.
*H03F 3/04* (2006.01)
*H03F 3/45* (2006.01)
(Continued)

(52) U.S. Cl.
CPC ............ *H03F 3/45071* (2013.01); *H01Q 1/50* (2013.01); *H03F 1/56* (2013.01); *H03F 3/193* (2013.01);
(Continued)

(58) Field of Classification Search
USPC ................. 330/305, 296, 302, 136
IPC ........................................... H03F 3/04
See application file for complete search history.

(56) References Cited

U.S. PATENT DOCUMENTS 5,406,225 A  4/1995  Iida
6,331,804 B1 * 12/2001 Shimizu et al. ............... 330/285
(Continued)

FOREIGN PATENT DOCUMENTS

JP  06-177658 A  6/1994
JP  2002-009559 A  1/2002
(Continued)

OTHER PUBLICATIONS

Written Opinion issued in Application No. PCT/JP2012/081536 dated Feb. 19, 2013.
(Continued)

*Primary Examiner* — Patricia T Nguyen
(74) *Attorney, Agent, or Firm* — Pearne & Gordon LLP

(57) ABSTRACT

When the frequency bandwidth of a high frequency signal to be amplified is changed, the linearity of a high frequency module deteriorates. A high frequency module has an amplifier circuit including an amplification transistor and a variable impedance circuit, and an output matching network. Based on an amplifying operation, the amplified high frequency signal will contain unwanted signals of secondary distortion components. In a frequency band that generates such unwanted signals of secondary distortion components, the output impedance of the amplifier circuit is changed so that the impedance will not match between the amplifier circuit and the output matching network. The output impedance of the amplifier circuit is changed by controlling the variable impedance circuit.

20 Claims, 7 Drawing Sheets

(51) Int. Cl.
  *H03F 1/56* (2006.01)
  *H03F 3/195* (2006.01)
  *H03F 3/24* (2006.01)
  *H03F 3/50* (2006.01)
  *H04B 1/04* (2006.01)
  *H01Q 1/50* (2006.01)
  *H03F 3/193* (2006.01)
  *H03H 7/40* (2006.01)

(52) U.S. Cl.
  CPC ............... *H03F 3/195* (2013.01); *H03F 3/245* (2013.01); *H03F 3/45183* (2013.01); *H03F 3/50* (2013.01); *H03H 7/40* (2013.01); *H04B 1/0458* (2013.01); *H03F 2003/45008* (2013.01); *H03F 2200/108* (2013.01); *H03F 2200/111* (2013.01); *H03F 2200/222* (2013.01); *H03F 2200/387* (2013.01); *H03F 2203/45454* (2013.01); *H03F 2203/45466* (2013.01); *H03F 2203/45476* (2013.01); *H03F 2203/45576* (2013.01); *H03F 2203/45631* (2013.01); *H03F 2203/45634* (2013.01); *H03F 2203/45674* (2013.01)

(56) References Cited

U.S. PATENT DOCUMENTS

| | | | |
|---|---|---|---|
| 6,359,516 | B1 | 3/2002 | Luo |
| 7,202,734 | B1* | 4/2007 | Raab .............................. 330/126 |
| 7,279,979 | B2* | 10/2007 | Autti ............................. 330/285 |
| 7,495,515 | B1* | 2/2009 | Branch et al. ................. 330/305 |
| 7,663,555 | B2* | 2/2010 | Caimi et al. .................. 343/702 |
| 2004/0032700 | A1 | 2/2004 | Matsuno |
| 2007/0024370 | A1 | 2/2007 | Hirata |
| 2008/0169877 | A1* | 7/2008 | Banba ............................ 330/306 |
| 2012/0105147 | A1* | 5/2012 | Harris et al. .................... 330/57 |

FOREIGN PATENT DOCUMENTS

| | | |
|---|---|---|
| JP | 2004-505482 A | 2/2004 |
| JP | 2007-036973 A | 2/2007 |
| JP | 2009-165100 A | 7/2009 |

OTHER PUBLICATIONS

International Search Report issued in Application No. PCT/JP2012/081536 dated Feb. 19, 2013.

* cited by examiner

| SELECTION SIGNAL BANDWIDTH | SWITCH CONTROL | | | |
|---|---|---|---|---|
| | SWITCH 509 | SWITCH 510 | SWITCH 511 | SWITCH 512 |
| 5 MHz | ON | OFF | OFF | OFF |
| 10 MHz | OFF | ON | OFF | OFF |
| 15 MHz | OFF | OFF | ON | OFF |
| 20 MHz | OFF | OFF | OFF | ON |

HIGH FREQUENCY MODULE AND PORTABLE TERMINAL USING SAME

BACKGROUND

The present invention relates to a high frequency module, and particularly relates to technology that can be effectively applied to a high frequency module, which transmits high frequency signals, for use in a portable terminal.

Patent Publication JP-A-2009-165100 (Patent Document 1) discloses an amplifier circuit capable of reducing high frequency components and maintaining linearity by forming a low-pass filter with a passive device at the bias portion of an amplification transistor and thereby adjusting the impedance.

Patent Document 1: Patent Publication JP-A-2009-165100

BRIEF SUMMARY

In Patent Document 1, the low-pass filter is formed using a passive device, and no consideration is given to reducing the high frequency components of a plurality of frequencies that are generated due to changes in the frequency bandwidth. Other objects and novel features of the present invention will become apparent from the descriptions of this specification and the appended drawings.

According to one embodiment, a high frequency module comprises an amplifier circuit including an amplification transistor and a variable impedance circuit, and a matching network connected to the amplifier circuit. The output impedance of the amplifier circuit changes in accordance with a control signal according to the frequency bandwidth supplied to the variable impedance circuit.

According to this embodiment, the high frequency component can be reduced and the linearity can be maintained even when the frequency bandwidth is changed.

DETAILED DESCRIPTION

Figure 1:
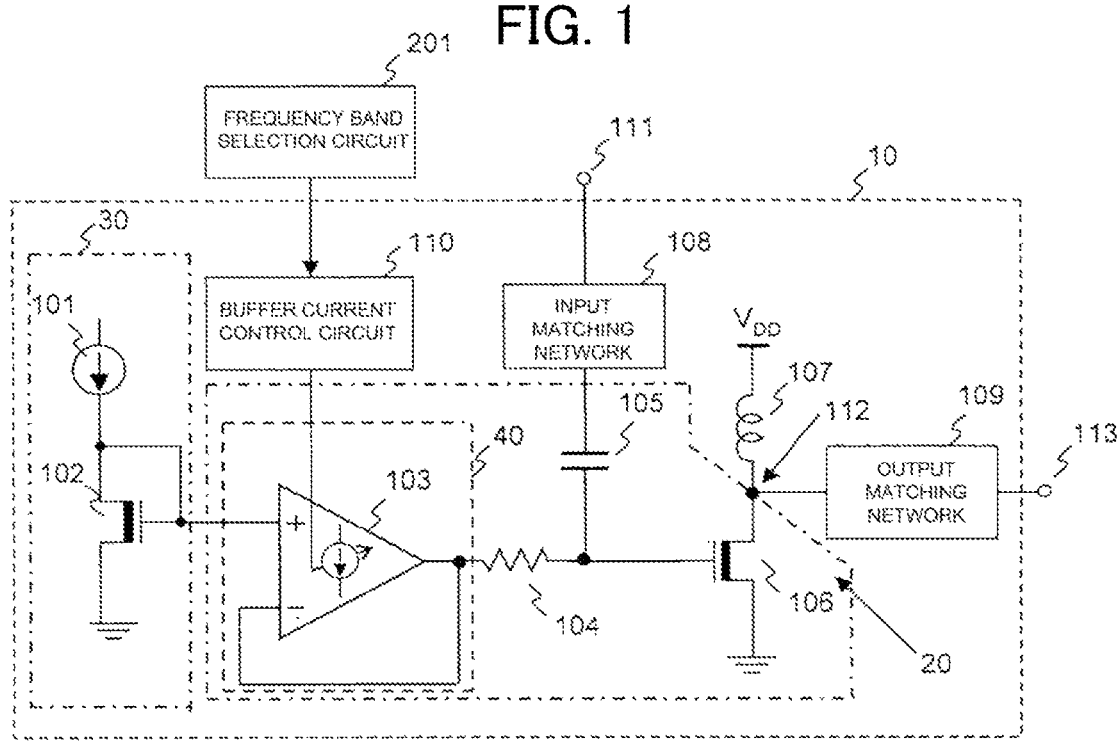
FIG. 1 is a circuit diagram showing the high frequency module according to Embodiment 1.

In a plurality of embodiments described below, while there is no particular limitation, a high frequency module compatible with LTE (Long Term Evolution) as the communication standard of mobile phones is explained as an example. In LTE, a plurality of frequency bands that are adjacent to each other are used as carrier waves, and the communication signal (hereinafter also referred to as the "high frequency signal") is a composite signal of the signals in the respective frequency bands. With this plurality of frequency bands that are adjacent to each other as one unit, a plurality of units fit within a frequency bandwidth that is set forth in the communication standard of LTE. As the frequency bandwidths that are set forth in the communication standard of LTE, there are, for example, 5 MHz, 10 MHz, 15 MHz, and 20 MHz.

Considerations given with regard to the problems that arise in the transmission of communication signals that are formed by synthesizing the signals existing in a plurality of frequency bands are now explained.

[Generation Principle of Secondary and Tertiary Distortion Components]

When a signal is amplified with an amplifier circuit (hereinafter also referred to as an "amplifier"), the amplified signal contains a distortion due to the nonlinearity of the amplifier. Based on this distortion, the signal leaks to a frequency band other than the frequency band of the signal that was input (input signal), thus generating an adjacent channel interference which becomes an interference to the signals existing in the adjacent frequency bands. When the input signal to the amplifier is x(t) and consideration is given to secondary distortion components and tertiary distortion components, the output signal y(t) of the amplifier is represented as follows:

[Formula 1]

$$y(t) \approx \alpha_1 x(t) + \alpha_2 x^2(t) + \alpha_3 x^3(t) \qquad (1).$$

Here, the term "secondary distortion components" refers to the distortion components of the output signal caused by the quadratic components of non-linear characteristics of the amplifier, and the term "tertiary distortion components" refers to the distortion components of the output signal caused by the cubic components of non-linear characteristics of the amplifier.

In order to facilitate the explanation, on the assumption that the input signal is a composite signal of the signals of two waves having an angular frequency of ω1 and ω2 (Formula 2),

[Formula 2]

$$x(t) = A_1 \cos \omega_1 t + A_2 \cos \omega_2 t \qquad (2).$$

when Formula (2) above is substituted into Formula (1) above, Formula (3) is obtained as the secondary distortion components contained in the output signal y(t).

[Formula 3]

$$\alpha_2 A_1 A_2 \cos(\omega_1 + \omega_2)t + \alpha_2 A_1 A_2 \cos(\omega_2 - \omega_1) \qquad (3)$$

Similarly, Formula (4) is obtained as the tertiary distortion components.

[Formula 4]

$$\frac{3}{4}\alpha_3 A_1^2 A_2 \cos(2\omega_1 + \omega_2)t + \frac{3}{4}\alpha_3 A_1^2 A_2 \cos(2\omega_1 - \omega_2)t + \frac{3}{4}\alpha_3 A_2^2 A_1 \cos(2\omega_2 + \omega_1)t + \frac{3}{4}\alpha_3 A_2^2 A_1 \cos(2\omega_2 - \omega_1)t \quad (4)$$

Figure 2:
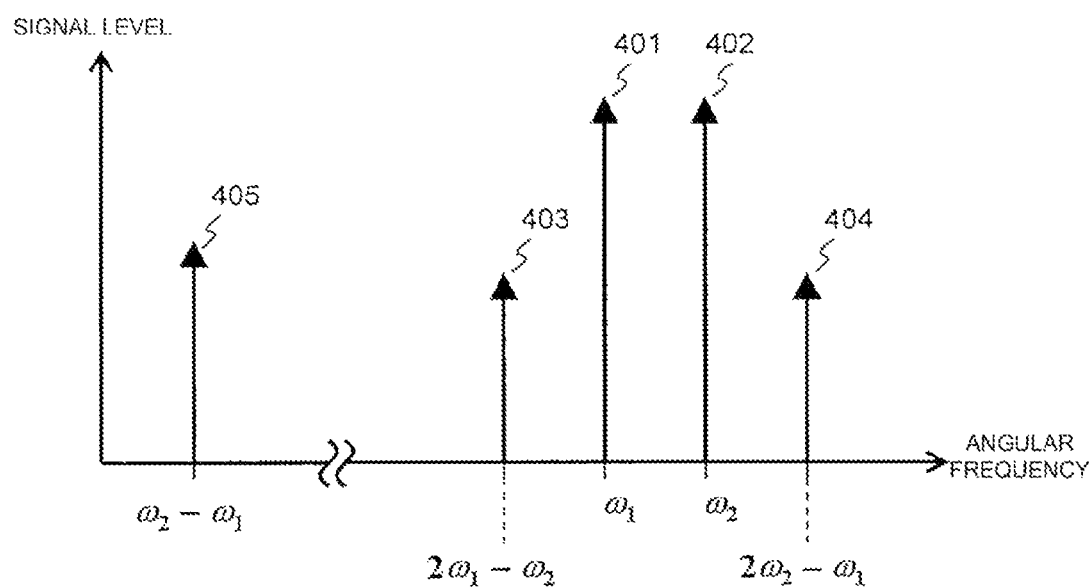
FIG. 2 is an explanatory diagram explaining Embodiment 1.

When the second member of Formula (3) among the secondary distortion components and the second member and the fourth member of Formula (4) among the tertiary distortion components are represented on a frequency axis, the result will be as shown in FIG. 2.

In FIG. 2, the main signals 401 and 402 are the components of the input signal to be primarily amplified (levels of the output signal having a frequency that is the same as the frequency of the input signal), and exist in a frequency band of the input signal. Meanwhile, in this diagram, signals 403 and 404 are tertiary distortion components, and a signal 405 is a secondary distortion component. Relating this to Formulas (3) and (4) above, the signal 403 corresponds to the tertiary distortion component of the second member in Formula (4), the signal 404 corresponds to the tertiary distortion component of the fourth member in Formula (4), and the signal 405 corresponds to the secondary distortion component of the second member in Formula (3). These distortion components are unwanted components that are generated due to the non-linear characteristics of the amplifier. In particular, since the signals 403 and 404 as the tertiary distortion components are generated in the near-by frequency of the main signals 401 and 402, they cause the adjacent channel interference described above. Thus, a low level of tertiary distortion components of the output signal is demanded in an amplifier.

Figure 10:
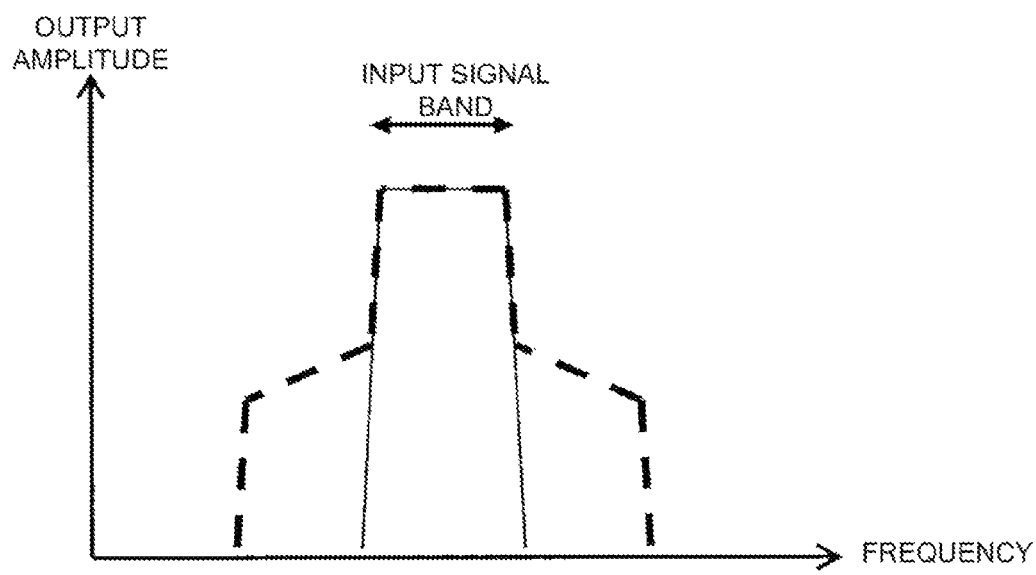
FIG. 10 is an explanatory diagram explaining Embodiment 1.

In order to facilitate the explanation as described above, in FIG. 2, a case where the input signal is a composite signal of two signals having mutually different frequencies is explained. Nevertheless, an input signal as a communication signal is, in effect, a composite signal of signals existing in a plurality of frequency bands. Moreover, in the case of LTE, it is also possible to consider the input signal as being a composite signal of signals in a frequency bandwidth (for instance, 5 MHz) set forth in the communication standard. FIG. 10 shows the frequency characteristics of an output signal in a case where a communication signal, which is closer to an actual communication signal, formed by synthesizing a plurality of signals (and not a result of synthesizing signals of two waves) existing in a frequency bandwidth is input to an amplifier. When a communication signal existing in the frequency bandwidth shown with the solid line is input, the output signal shown with the solid line is obtained when the amplifier has no non-linear characteristics at all. In other words, when the amplifier has no non-linear characteristics at all, the foregoing tertiary distortion components are not generated, and a signal of only the frequency band in the frequency bandwidth of the communication signal is output. Meanwhile, the characteristics shown with the broken line are the output characteristics of a signal that was affected by the tertiary distortion components as a result of the amplifier having non-linear characteristics. When there are tertiary distortion components, signal components (unwanted signal components) outside the frequency bandwidth of the communication signal are generated, and interfere with the other signals existing in the adjacent frequency bands.

The meaning of symbols used in each of Formulas (1), (2), (3) and (4) indicated above is as follows.

$\alpha 1$ is the coefficient of the basic frequency (frequency of the input signal), $\alpha 2$ is the coefficient of the quadratic non-linear term, and $\alpha 3$ is the coefficient of the cubic non-linear term. $\alpha 2$ and $\alpha 3$ above represent the level of distortion components that are applied to the output signal due to the non-linear characteristics of the amplifier. While an actual amplifier has a coefficient $\alpha 4$ of the quark non-linear term, a coefficient $\alpha 5$ of the quintic non-linear term, a coefficient $\alpha 6$ of the sixth-degree non-linear term and so on, since the value of the coefficients decreases as the degree advances, the fourth degree onward are ignored for the sake of convenience.

In each of the foregoing formulas, A1 represents the amplitude of one signal of the signals of two waves that are input, and A2 represents the amplitude of the other signal of the signals of two waves that are input. Moreover, in each of the foregoing formulas, the signals are sinusoidal waves of two waves of different frequencies.

[Adverse Effects Caused by Secondary Distortion]

A case where a part of the secondary distortion components that are generated after amplification leaks into the amplifier circuit as described above is now explained. For instance, such a case is where the secondary distortion components return to the amplification transistor 106 of FIG. 1, described later, and are added to the input signal (signal of a frequency band to be amplified by the amplification transistor). An amplification transistor is, for example, a field effect-type transistor (hereinafter also referred to as a "MOS transistor"), and the input signal and a part of the secondary distortion components are superimposed and supplied to the gate thereof, and then amplified.

On the assumption that the input signal is A1 cos ω1t as one of the main signals and A3 cos(ω2−ω1)t as the secondary distortion component, when these members are substituted into Formula (1), the following member is obtained

[Formula 5]

$$\frac{3}{4}\alpha_3 A_3^2 A_1 \cos(2\omega_2 - \omega_1)t \quad (5)$$

Here, in order to simplify the formula, A3 stands for α2×A1×A2.

Moreover, on the assumption that the input signal is A2 cos ω2t as the other main signal and A4 cos(ω2−ω1)t as the secondary distortion component, when these members are substituted into Formula (1), the following member is obtained.

[Formula 6]

$$\frac{3}{4}\alpha_3 A_4^2 A_2 \cos(2\omega_1 - \omega_2)t \quad (6)$$

In this case also, in order to simplify the formula, A4 stands for α2×A1×A2.

Since the angular frequency in Formulas (5) and (6) is equal to the frequency of the second member of Formula (4) as the tertiary distortion component and the frequency of the fourth member of Formula (4) described above, these tertiary distortion components are mutually superimposed. In other words, the existence of secondary distortion components will further increase the tertiary distortion components that cause the adjacent channel interference.

Upon considering a case where a communication signal having a frequency bandwidth is input as an input signal of an amplifier, the frequency in which the secondary distortion components appear will change according to the bandwidth. For example, when the bandwidth of the frequency band of the input signal is ω4 to ω3 (ω4>ω3), the secondary distortion components will appear in the frequency of 0 to ω4−ω3. The bandwidth (width) of the frequency band means 5 MHz, 10 MHz, 15 MHz, 20 MHz or the like in the case of LTE as described above. Thus, upon taking 5 MHz as an example, the second distortion components will appear in 0 to 5 MHz, and, when the bandwidth is 10 MHz, the secondary distortion components will appear in 0 to 10 MHz.

[Outline of One Embodiment]

The outline of one embodiment is now explained with reference to FIG. 1. A high frequency module 10 includes an amplifier circuit 20 and an output matching network 109. The amplifier circuit 20 includes an output terminal 112, a high frequency amplification transistor 106 and a variable impedance circuit 103. The variable impedance circuit 40 receives a control signal according to the frequency bandwidth of the communication signal, and the output impedance thereof changes according to the value of the control signal. The output impedance of the amplifier circuit 20 viewed from the output terminal 112 is the synthetic impedance of at least the variable impedance circuit 40 and the amplification transistor 106, and will change as a result of changing the output impedance of the variable impedance circuit 40. Accordingly, the output impedance of the amplifier circuit 20 can be changed based on the control signal for each frequency bandwidth of the communication signal. Upon amplifying the communication signal, the secondary distortion components are reflected in the matching network 109 without matching the impedance of the output matching network 109 and the output impedance of the amplifier circuit 20 as viewed from the output terminal 112 in the frequency band of the secondary distortion components. It is thereby possible to reduce the signals of secondary distortion components that are transmitted to the amplifier circuit 20, reduce the generation of unwanted signals of tertiary distortion components, and ensure the linearity of the amplifier circuit, and this in turn enables the provision of a high frequency module with reduced interference to the adjacent channel.

Moreover, the outline of another embodiment is also explained by way of reference. The variable impedance circuit includes a buffer circuit, and the buffer circuit is connected to configure the voltage follower circuit. The voltage follower circuit receives, from a bias circuit, a bias voltage for biasing the amplification transistor 106, and supplies a bias voltage according to the received bias voltage to the amplification transistor. When a high frequency signal is supplied to the amplification transistor, the high frequency signal is also transmitted to the output of the voltage follower circuit. Nevertheless, with the voltage follower circuit, since the input and output thereof are electrically isolated, it is possible to prevent the high frequency signal from being transmitted to the bias circuit. While a coil for blocking the high frequency may also be provided between the bias circuit and the amplification transistor, the use of the voltage follower circuit enables further downsizing. Needless to say, since the voltage follower circuit also functions as the variable impedance circuit described above, it is possible to reduce the interference to the adjacent channels.

While the embodiments are now explained, it should be understood that the components that are given the same reference numeral mutually have the same function.

Embodiment 1

FIG. 1 shows the circuit diagram of the high frequency module according to Embodiment 1. In this diagram, the high frequency module 10 includes an amplifier circuit 20, a bias circuit 30, and an output matching network 109.

The amplifier circuit 20 includes a high frequency amplification transistor 106, and a variable impedance circuit 40. In this embodiment, the variable impedance circuit 40 includes a voltage follower circuit 103 that is configured from a buffer circuit.

The bias circuit 30 includes a bias current source 101 and a bias MOS transistor 102. The drain and source of the bias MOS transistor 102 are connected, and a bias current is supplied to the drain of the bias MOS transistor 102 from the bias current source 101. Consequently, the bias circuit 30 generates a constant voltage according to the bias current from the bias current source 101, and supplies the generated constant voltage to a positive input (+) of the voltage follower circuit 103.

The output of the voltage follower circuit 103 is connected to its negative input. Moreover, the output of the voltage follower circuit 103 is connected to the gate of the high frequency amplification transistor 106 via a resistor 104 for reducing high frequency signals. The gate of the amplification transistor 106 is biased with the bias voltage output from the voltage follower circuit 103. The high frequency communication signal (high frequency signal) is supplied to the gate of the amplification transistor 106 from an input matching network 108 via a DC cutoff capacitor 105 for cutting off the DC components.

The resistor 104 functions to attenuate the high frequency signals from being transmitted to the voltage follower circuit 103. With regard to the high frequency signal that were transmitted to the output of the voltage follower circuit 103 as a result of not being fully attenuated by the resistor 104, it is possible to prevent such high frequency signals from being transmitted to the bias circuit 30 by electrically isolating the bias circuit 30 and the resistor 104 (or the gate of the amplification transistor 106) via the voltage follower circuit 103. It is thereby possible to prevent the fluctuation of the constant voltage that results from the high frequency signals being transmitted to the bias circuit 30. Since the voltage follower circuit 103 is provided, the resistor 104 may be omitted for the purpose of attenuating the high frequency signals. Similar to the above, by adopting the voltage follower circuit as the buffer circuit configuring the variable impedance circuit, an effect is yielded in that the bias voltage from the bias circuit can be supplied to the amplification transistor, and the high frequency signals can be prevented from being transmitted to the bias circuit. As the configuration for preventing the high frequency signals from being transmitted to the bias circuit, the use of a coil (inductance) in substitute for the voltage follower circuit may also be considered. In this embodiment, while there is no particular limitation, the amplifier circuit 20 (including the voltage follower circuit 103, the resistor 40, the amplification transistor 106, and the capacitor 105) and the bias circuit 30 (including the transistor 102 and the bias current source 101) can be formed on one semiconductor chip. When a coil for reducing the high frequency signals is used upon forming the amplifier circuit 20 on a semiconductor chip, the occupancy area of the semiconductor chip will increase. The increase in the area of the semiconductor chip can be inhibited by using a voltage follower circuit as with this embodiment.

An input matching network 108 is a matching network for performing impedance matching between the front-stage amplifier connected to the terminal 111 or the signal source (not shown) and the amplifier circuit 20.

In FIG. 1, a load inductor 107 is connected between an output terminal 112 and a power source voltage point Vdd, and operates as a load of the high frequency amplification transistor 106. An output matching network 109 is connected between the subsequent-stage circuit (not shown) connected to the terminal 113 of the module and the output terminal 112 of the amplifier circuit 20, and performs impedance matching thereof.

In this diagram, a buffer current control circuit 110 controls the current of the voltage follower circuit 103. Moreover, a frequency band selection circuit 201 is provided outside the high frequency module 10. While explained in detail later, the frequency band selection unit 201 is used for designating the frequency bandwidth of the communication signal to be amplified with the amplifier circuit 20.

The high frequency amplification transistor 106 is biased by the bias voltage supplied from the voltage follower circuit 103 via the resistor 104, amplifies the high frequency signals supplied via the DC cutoff capacitor 105, and outputs the amplified high frequency signals to the output matching network 109.

The voltage follower circuit 103 that also operates as the variable impedance circuit 40 is now explained.

Figure 3:
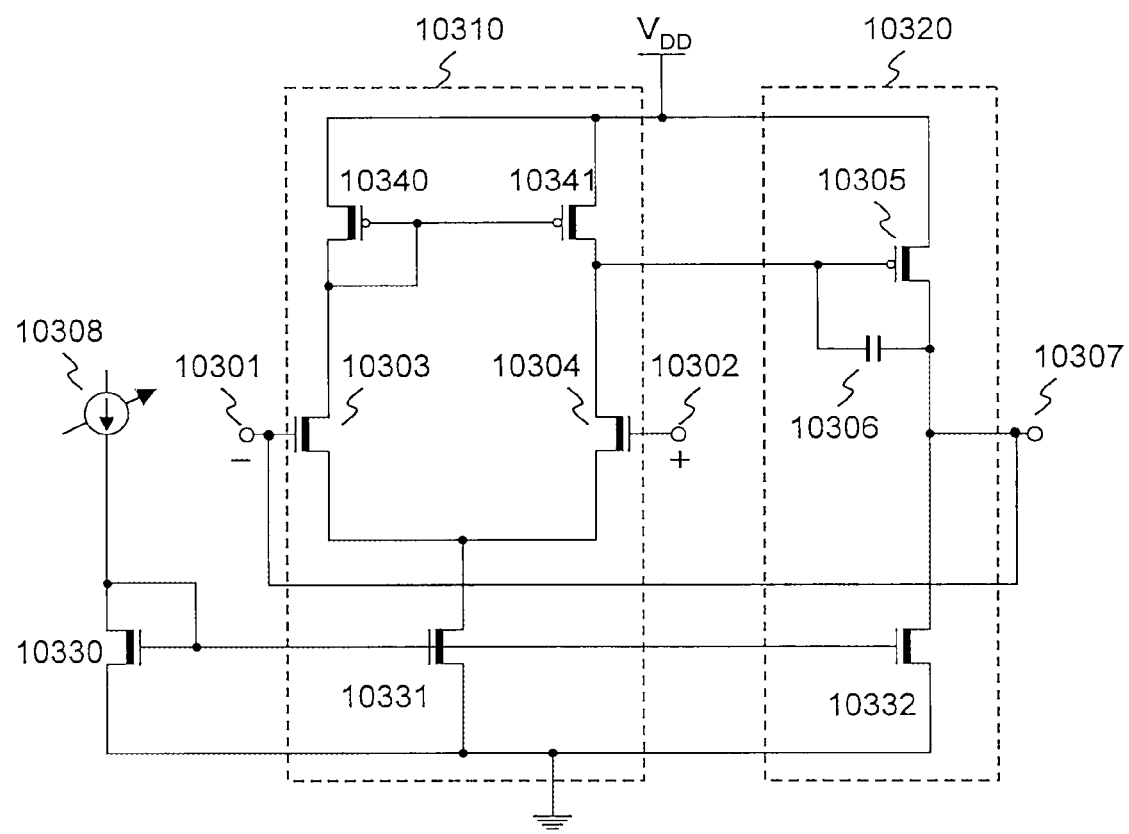
FIG. 3 is a circuit diagram showing the voltage follower circuit that is used in the high frequency module of Embodiment 1.

FIG. 3 shows an example of the voltage follower circuit 103 as a circuit diagram. The operational amplifier circuit configuring the voltage follower circuit includes a bias current source 10308, input terminals 10301 and 10302, a differential amplifier stage 10310, a second-stage amplification stage 10320, and an output terminal 10307. The differential amplifier stage 10310 includes a pair of differential amplification MOS transistors 10303 and 10304, and the gate (input terminal 10302) of one differential amplification MOS transistor 10304 becomes a positive input terminal of the voltage follower circuit 103. The gate (input terminal 10301) of the other differential amplification MOS transistor 10303 becomes a negative input terminal of the voltage follower circuit 103. A pair of current mirror-connected load MOSFETs 10340 and 10341 are connected to the pair of differential amplification MOS transistors. The second-stage amplification stage includes an amplification MOS transistor 10305, and a phase compensation capacitor 10306. In this diagram, the current source MOSFETs 10330, 10331 and 10332 are current mirror-connected, and supply the current according to the current from the bias current source 10308 to the differential amplification MOS transistor and the amplification MOS transistor 10305. In order to configure the voltage follower circuit, the output of the operational amplifier circuit is connected to the input terminal 10301.

The voltage follower circuit 103 functioning as the variable impedance circuit 40 (buffer circuit) is now explained. When the voltage follower circuit depicted in FIG. 3 is viewed as a buffer circuit, the output frequency characteristics relative to the AC input signal, which determine the output impedance characteristics, are decided based on the transconductance "gm" of the amplification MOS transistors 10303 and 10304 and the value C of the phase compensation capacitor 10306. Formula (7) represents the case when the unity gain frequency to become the cutoff frequency of the output frequency characteristics relative to the AC input signal of the buffer circuit is ωu.

[Formula 7]

$$\omega_u = \frac{g_m}{C} \quad (7)$$

In Formula (7), when the mobility "μ", the gate oxide film capacity $C_{OX}$ per unit area, the gate width "W", the gate length "L", and the drain current $I_D$ of the MOS transistor are used, the transconductance "gm" of the MOS transistor is represented as Formula (8).

[Formula 8]

$$g_m \approx \sqrt{\mu C_{ox} \frac{W}{L} I_D} \quad (8)$$

By changing the drain current $I_D$ in Formulas (7) and (8), the transconductance "gm" will change and the cutoff frequency of the buffer frequency characteristics will change. In other words, by changing the drain current of the amplification MOSFETs 10303 and 10304, it is possible to change the cutoff frequency of the buffer circuit 40 and the output impedance of the buffer circuit 40 (voltage follower circuit 103).

Figure 4:
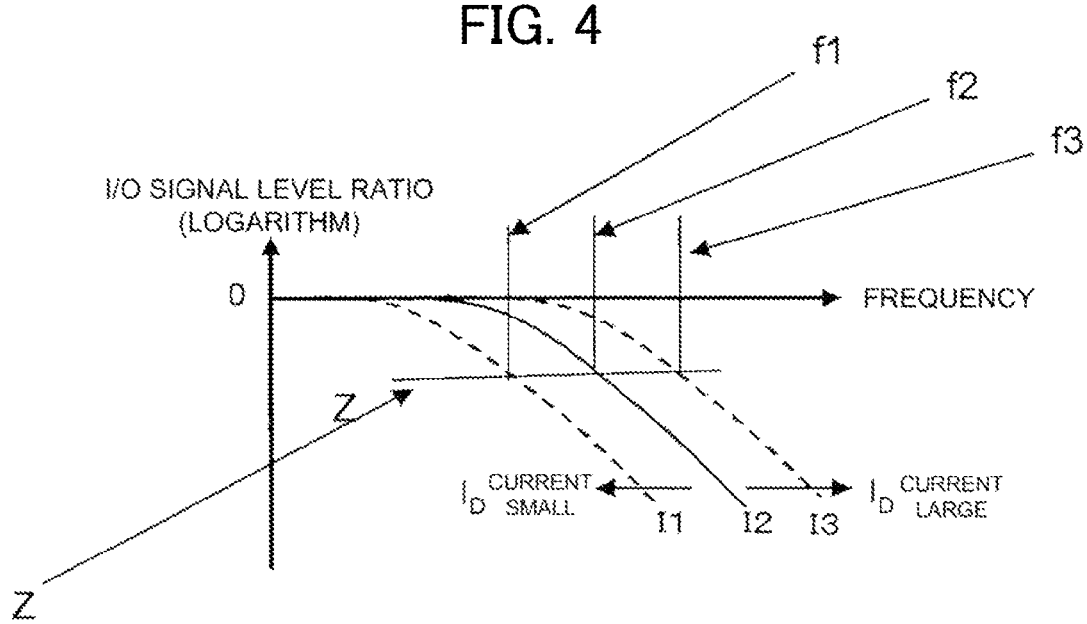
FIG. 4 is an explanatory diagram explaining Embodiment 1.

FIG. 4 shows an example of the frequency characteristics of the buffer circuit. When the drain current $I_D$ of the MOS transistor is reduced, then the cutoff frequency will decrease, and, contrarily, when the drain current $I_D$ is increased, the cutoff frequency will increase. In FIG. 4, while the vertical axis represents an input to output signal level ratio, it can be deemed as an output impedance of the buffer circuit 40 (voltage follower circuit 103).

When the output impedance of the amplifier circuit 20 is viewed from the output terminal 112 of the amplifier circuit 20, the output impedance becomes a synthetic impedance of the high frequency amplification transistor 106, the resistor 104, the DC cutoff capacitor 105 and the buffer circuit 40 (voltage follower circuit 103). Among these elements, it is difficult to adjust the impedance of the high frequency amplification transistor 106, the resistor 104 and the DC cutoff capacitor 105 after the high frequency module is manufactured. Meanwhile, as described above, the output impedance value of the buffer circuit 40 (voltage follower circuit 103) can be changed, for instance, by changing the drain current of the differential amplification MOSFET.

Returning to FIG. 4, the following description explains a case where, when the output impedance value of the amplifier circuit 20 becomes Z, the output impedance of the amplifier circuit 20 matches the impedance upon viewing the output matching network 109 from the output terminal 112 in the frequency band of the secondary distortion components.

In cases where the frequency band of the secondary distortion components is 0 to f1 (for instance, 0 to 5 MHz), when the drain current of the differential amplification MOS transistor in the buffer circuit 40 is set to I1, the output impedance of the amplifier circuit 20 matches the impedance upon viewing the output matching network 109 from the output terminal 112 in the frequency band of the secondary distortion components. When impedance matching occurs, the secondary distortion components are transmitted from the output terminal 112 toward the gate of the high frequency amplification transistor 106. As described above, the transmission of the secondary distortion components increases the unwanted signals of the tertiary distortion components.

Thus, when the frequency band of the secondary distortion components is 0 to f1, the drain current of the differential amplification MOS transistor in the buffer circuit 40 is set to I2 or I3, when the frequency band of the secondary distortion components is 0 to f2 (0 to 10 MHz), the drain current is set to I3, and when the frequency band of the secondary distortion components is 0 to f3 (0 to 15 MHz), the drain current is set to be greater than I3. It is thereby possible to prevent matching from occurring in the frequency band of the secondary distortion components. When the frequency bandwidth of the communication signal is broad, the drain current of the differential amplification transistor is set to be large (for instance, I3) since the range of the frequency band of the secondary distortion components is broad. It is thereby possible to cause the matching to occur between the output impedance of the amplifier circuit 20 and the impedance upon viewing the output matching network 109 from the output terminal 112 in the secondary distortion components of a frequency that is higher than the frequency range of the secondary distortion components. In other words, reflection based on impedance mismatching can be realized in the frequency band of the secondary distortion components, and it is thereby possible to prevent the secondary distortion components from being transmitted toward the gate side. Meanwhile, when the frequency bandwidth of the communication signal is narrow, the frequency range of the secondary distortion components is also narrow. Thus, even when the drain current of the differential amplification MOS transistor is small, since the impedance will match at a frequency that is higher than the frequency range of the secondary distortion components, and reflection based on impedance mismatching can be realized in the frequency band of the secondary distortion components, it is possible to prevent the secondary distortion components from being transmitted toward the gate side. In the foregoing case, since the drain current of the differential amplification MOS transistor can be reduced, low electric power consumption can be attained.

When the frequency bandwidth of the communication signal is constant, the frequency band of the secondary distortion components will also be within a predetermined range. In the foregoing case, the output impedance of the buffer circuit 40 may be set to a fixed value so that the overall synthetic impedance from the amplification transistor 106, the resistor 104, the DC cutoff capacitor 105 and the buffer circuit 40 will not match the impedance of the output matching network 109 viewed from the output terminal 112. Based on the above, it is possible to prevent the impedance matching of the foregoing synthetic impedance and the output-side impedance of the amplification MOS transistor, and thereby prevent the secondary distortion components from being transmitted into the amplifier circuit 20. Moreover, in the foregoing case, by configuring the voltage follower circuit with a buffer circuit, the coil for reducing the high frequency signals may be removed, and the semiconductor chip can be downsized.

Meanwhile, in cases where the frequency bandwidth of the communication signal changes, for instance, as with the case of LTE, when the output impedance of the buffer circuit 40 is fixed, the frequency bandwidth of the secondary distortion components will change as a result of the frequency bandwidth of the communication signal changing, and impedance matching will occur. Accordingly, due to the change in the frequency bandwidth of the communication signal, impedance matching will occur in the frequency band of the secondary distortion components among the output impedance of the buffer circuit 40, the synthetic impedance of the amplification MOS transistor 106 and the like, and the impedance upon viewing the output matching network 109 from the output terminal 112. This in turn causes the secondary distortion components to be transmitted, and consequently increases the tertiary distortion components.

Thus, the output impedance of the buffer circuit 40 is controlled and the transmission of the secondary distortion components caused by impedance matching is prevented even when the frequency bandwidth of the communication signal changes, and the frequency band of the secondary distortion components consequently changes.

In FIG. 1, the frequency band selection circuit 201 transmits, to the buffer current control circuit 110, the digital data indicating the frequency bandwidth of the signal to be transmitted. The buffer current control circuit 110 forms a control signal according to the frequency bandwidth of the signal according to the digital data, and controls the current source 10308 of the buffer circuit 40 depicted in FIG. 3.

Figure 5:
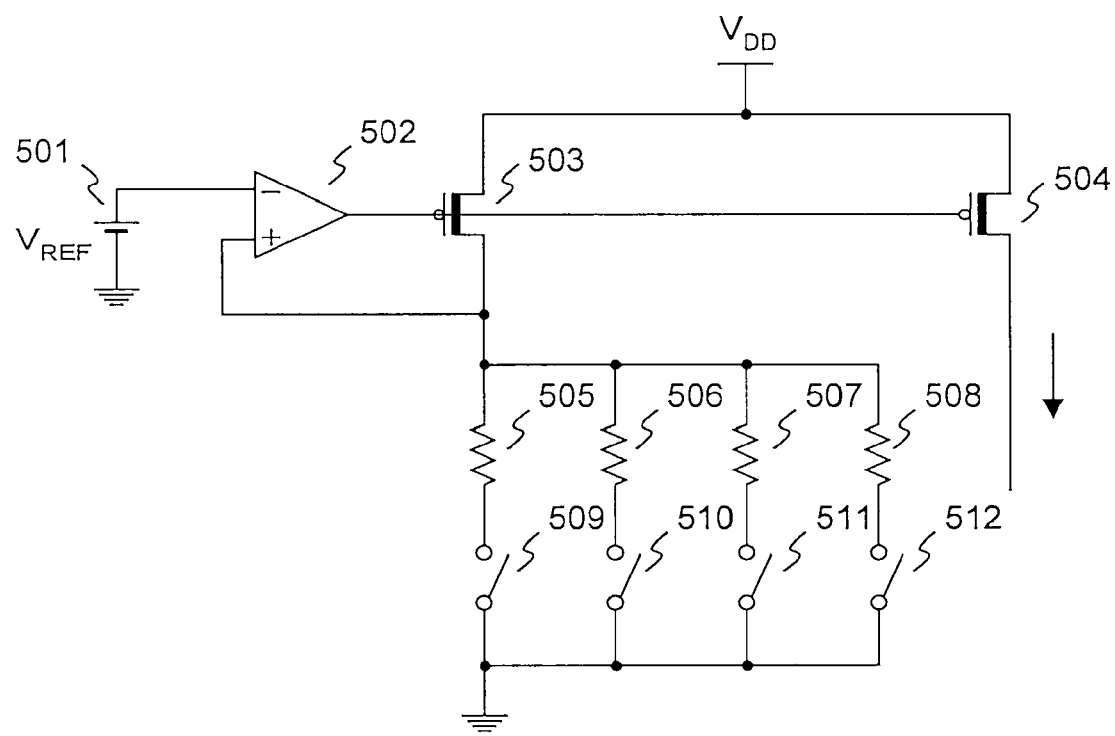
FIG. 5 is a circuit diagram showing an example of the buffer current control circuit that is used in the high frequency module of Embodiment 1.

FIG. 5 shows the circuit diagram of the current source 10308 of the buffer circuit 40. In FIG. 5, the current source 10308 includes resistors 505 to 508, and resistor selector switches 509 to 512. In this diagram, the reference voltage source 501 provides a reference voltage Vref of the voltage to be applied to one end of the respective resistors 505 to 508. The operational amplifier (comparator) 502 controls the voltage to be applied to the respective resistors 505 to 508 to be equal to the reference voltage based on feedback control. In this diagram, the MOS transistor 503 becomes the current source that supplies a current to the respective resistors in the feedback control. Moreover, the MOS transistor 504 is controlled by the operational amplifier 502 as with the MOS transistor 503, and becomes an output current source. The drain of the MOS transistor 503 is connected to the drain of the MOS transistor 10330 of FIG. 1. Based on the feedback control performed by the operational amplifier 502, the voltage applied to one end of the resistors 505, 506, 507 and 508 is fixed to the voltage of the reference voltage source 501. Consequently, the current that flows from the drain of the MOS transistor 503 is decided by the resistance value of the respective resistors 505, 506, 507 and 508. The resistors to be used are switched with the switches 509, 510, 511 and 512. Since the MOS transistors 503 and 504 are current mirror-connected, when the gate lengths of these MOS transistors are made to be equal, the ratio of the channel widths of the MOS transistors 503 and 504 and the ratio of the currents flowing through the MOS transistors 503 and 504 will coincide. In other words, the current that is output from the MOS transistor 504 becomes (drain current of MOS transistor 503)× ((channel width of MOS transistor 504)/(channel width of MOS transistor 503)). Based on the above, the intended current can be output to the MOS transistor 10330 (FIG. 3) by adjusting the voltage of the reference voltage source 501, the resistance values of the respective resistors 505, 506, 507 and 508, and the ratio of the channel widths of the MOS transistors 503 and 504.

The adjustment of the resistance values of the respective resistors is now explained. The value of the current source 10308 when the output impedance of the amplifier circuit 20 depicted in FIG. 1 does not match the impedance upon viewing the output matching network 109 from the output terminal 112 in the frequency band of the secondary distortion components is obtained for each frequency bandwidth of the communication signal in advance by way of circuit simulation or IC experimentation. The values of the respective resistors depicted in FIG. 5 are adjusted to become the obtained current value. For example, when the frequency bandwidth of the communication signal is 5 MHz, the switch 509 is turned ON, and the value of the resistor 505 is adjusted to become the current value that was obtained in the frequency bandwidth of 5 MHz. Similarly, when the frequency bandwidth of the signal is 10 MHz, the switch 510 is turned ON, and the value of the resistor 506 is adjusted to become the current that was obtained in 10 MHz. Similarly, when the frequency bandwidth of the signal is 15 MHz, the resistor 507 is adjusted (switch 511 is turned ON), and when the frequency bandwidth of the signal is 20 MHz, the resistor 508 is adjusted (switch 512 is turned ON).

Figures 6, 7:
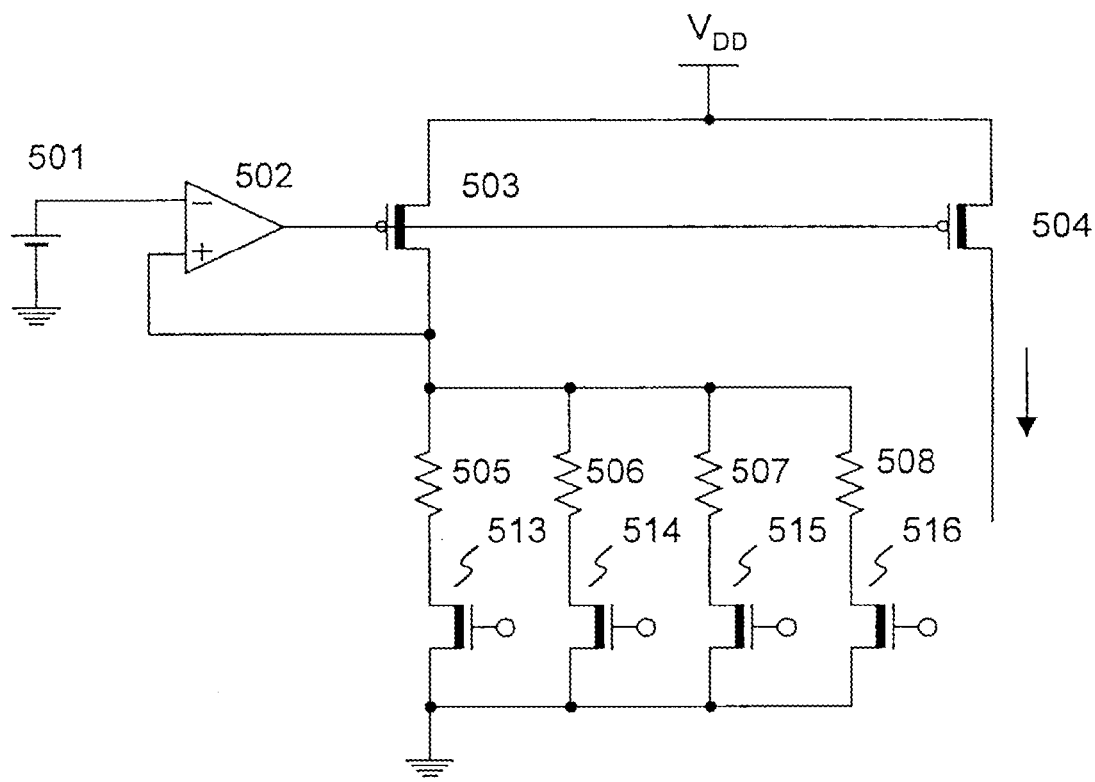
FIG. 6 is a circuit diagram showing another example of the buffer current control circuit that is used in the high frequency module of Embodiment 1.
FIG. 7 is an explanatory diagram explaining Embodiment 1.

When 5 MHz is selected by the frequency band selection circuit 201 after the current source has been adjusted as described above, the buffer current control circuit 110 turns ON the switch 509 of the current source 10308 (FIG. 5), turns OFF the other switches 510, 511 and 512, and forms a control signal so that only the resistor 506 is used. With other frequency bandwidths also, control is performed so that the respective resistor depicted in FIG. 7 are used according to the bandwidth. The switches are thereby controlled so that the current, which was predetermined according to the frequency bandwidth of the respective communication signals, will flow to the buffer circuit 40. In other words, the current that was predetermined according to the frequency bandwidth of the respective communication signals will flow as the operating current of the pair of differential amplification transistors 10303 and 10304 depicted in FIG. 3. As a result of performing the foregoing control, it is possible to reduce the transmission, to the amplifier circuit 20, of signals of the secondary distortion components according to the frequency bandwidth of the respective communication signals, and thereby ensure the linearity of the amplifier circuit.

The control signal formed by the buffer current control circuit 110 can be deemed a selection signal since the control signal is used for selecting the current value according to the respective frequency bandwidths.

FIG. 6 shows another circuit diagram of the current source 10308. In this diagram, the components that are the same as those depicted in FIG. 5 are given the same reference numeral, and the explanation thereof is omitted. The difference between FIG. 6 and FIG. 5 is in that the MOS transistors 513 to 516 are used as the switches 509, 510, 511 and 512. MEMS switches (not shown) may also be used in substitute for the MOS transistors. Moreover, the number of switches, MOS transistors, and resistors is not limited to four, and may be a number that coincides with the number of frequency bandwidths of the signals to be switched, or a number that is determined according to the control to be performed.

Figure 13:
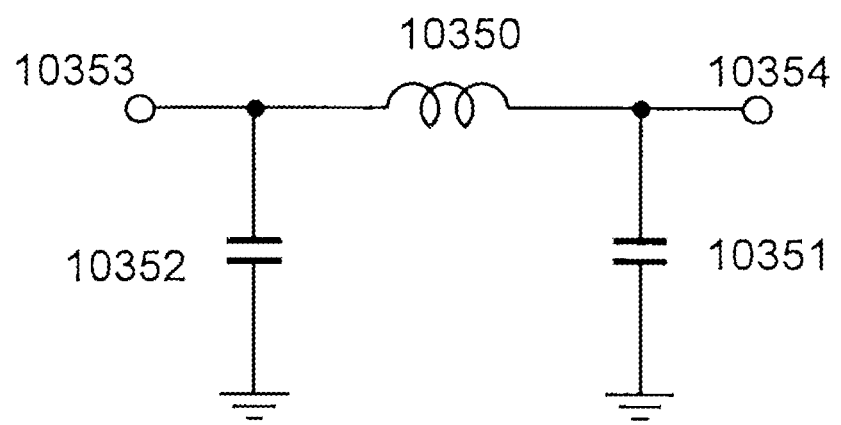
FIG. 13 is a circuit diagram showing an example of the matching network according to Embodiment 1 and Embodiment 2.

FIG. 13 shows an example of the output matching network 109 as a circuit diagram. In this diagram, 10353 indicates the input terminal to be connected to the output terminal 112 of the amplifier circuit 20, and 10354 indicates the output terminal to be connected to the terminal 113 depicted in FIG. 1. A coil (inductance) 10350 is connected between the input terminal 10353 and the output terminal 10354, and capacitors 10352 and 10351 are connected between the ground potential point and either ends of the coil 10350. In this embodiment, the output matching network is configured from a so-called π-type filter. The values of the respective elements are set so that the output matching network 109 matches the input impedance in the input terminal 10353 and the output impedance of the amplifier circuit and the output impedance in the output terminal 10354 matches the impedance of the circuit (for instance, amplifier) connected to the terminal 113 depicted in FIG. 1 in the frequency band of the signal to be communicated.

The impedance upon viewing the output matching network 109 from the output terminal 112 as referred to in the foregoing explanation refers to the synthetic impedance of the input impedance of the output matching network 109 and the load inductance 107 connected to the output terminal 112 in the frequency band of the secondary distortion components.

Figure 8:
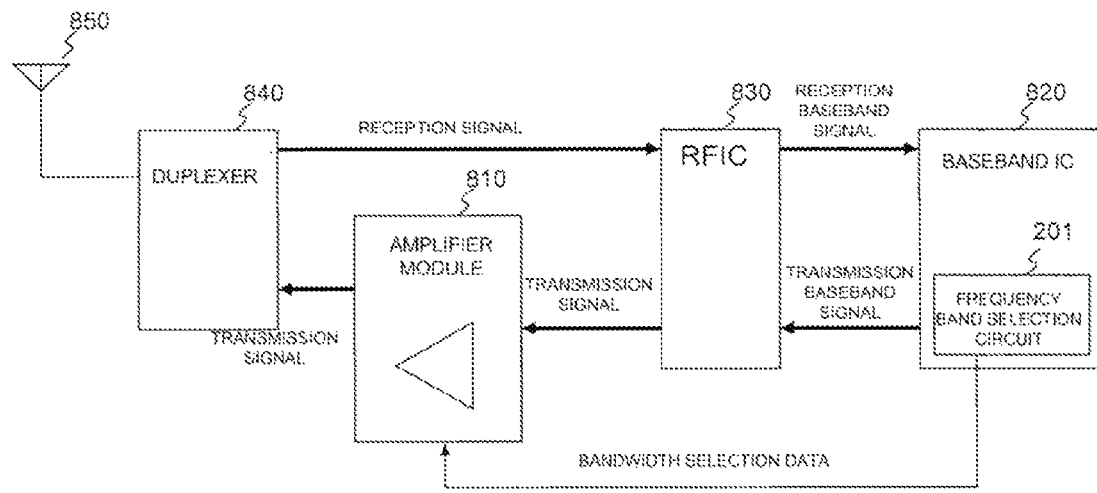
FIG. 8 is a block diagram showing an example of the portable terminal that uses the high frequency module according to Embodiment 1.

FIG. 8 shows an example of the portable terminal as a block diagram. In this diagram, 820 indicates a baseband semiconductor integrated circuit device (hereinafter also referred to as an "IC") that forms and outputs a baseband signal to be transmitted (transmission baseband signal). The transmission baseband signal is amplified by an RF signal processing IC (RFIC) 830, subject to frequency conversion and converted into a high frequency communication signal, and then supplied to the amplifier module 810. The transmission signal amplified by the amplifier module 810 is supplied, via a duplexer 840, to an antenna 850 to perform the transmission/reception, and then transmitted. The duplexer 840 utilizes the fact that the frequency bands of a transmission signal and a reception signal are different, uses band-pass filter characteristics, transmits a transmission signal from the amplifier module 810 to the antenna 850, and transmits a reception signal from the antenna 850 to the RF signal processing IC 830 without causing it to flow into the amplifier module 810. The baseband IC 820 includes the frequency bandwidth selection unit 201 described above, and the amplifier module 810 includes the high frequency module. Set in the baseband IC 820 is a frequency bandwidth of a communication signal for use in transmission and reception. The frequency bandwidth selection circuit 201 generates the bandwidth selection data according to the set information, and transmits the generated bandwidth selection data as a digital signal to the buffer current control circuit 110 in the amplifier module 810 via a digital interface (not shown).

Figure 9:
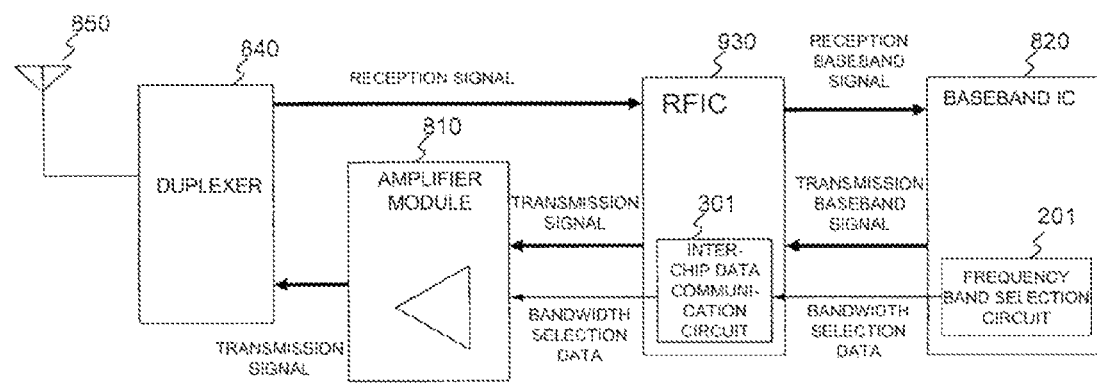
FIG. 9 is a block diagram showing another example of the portable terminal that uses the high frequency module according to Embodiment 1.

FIG. 9 shows another example of the portable terminal as a block diagram. In this diagram also, the components that are the same as those depicted in FIG. 8 are given the same reference numeral, and the explanation thereof is omitted. In the example of FIG. 9, the RF signal processing IC 930 includes an inter-chip data communication circuit 301 that collectively receives the control signals (including the bandwidth selection data) from the baseband IC 820, and transmits, to the amplifier module 810, the control signals (including the bandwidth selection data) that are used by the amplifier module 810. Other than including the inter-chip data communication circuit 301, the RF signal processing IC 930 is configured the same as the RF signal processing IC 830.

While a configuration that is suitable for an FDD system (Frequency Division Duplex) was explained as an example of the portable terminal with reference to FIG. 8 and FIG. 9, the present invention is not limited thereto, and the present invention may also be applied to a portable terminal of a TDD (Time Division Duplex) system.

Embodiment 2

Figure 11:
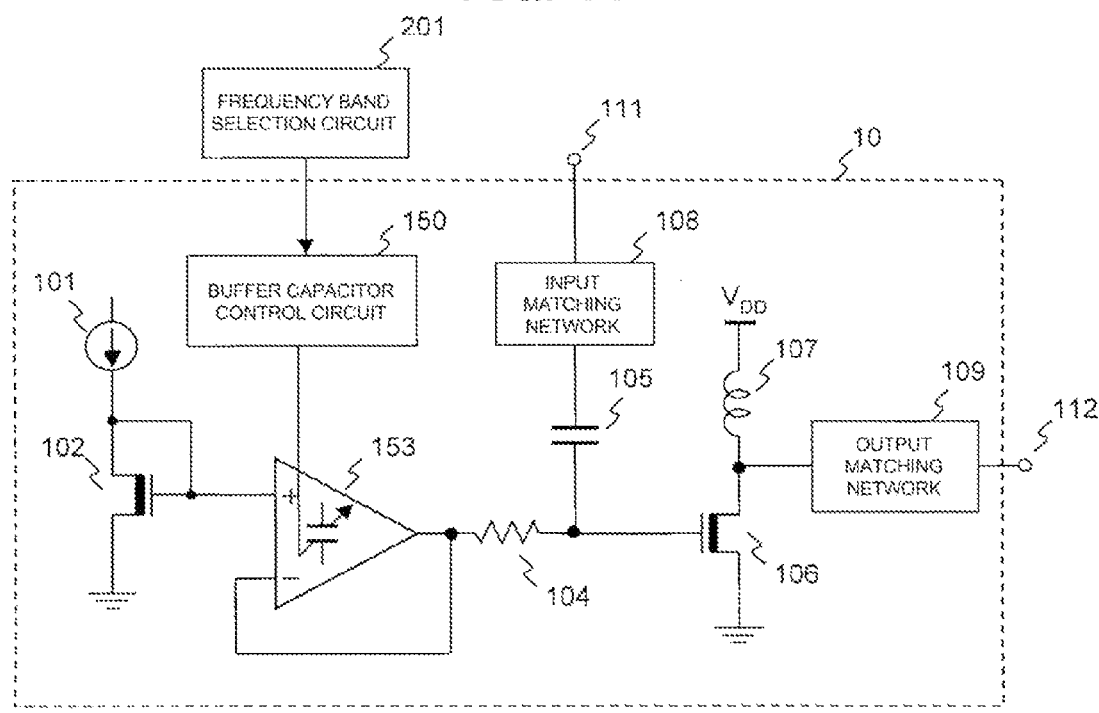
FIG. 11 is a circuit diagram showing the high frequency module according to Embodiment 2.

FIG. 11 shows a circuit of the high frequency module according to the second embodiment. In this diagram also, the components that are the same as those depicted in FIG. 1 are given the same reference numeral, and the explanation thereof is omitted. Embodiment 2 differs from Embodiment 1 with respect to the points of comprising a buffer capacitor control circuit 150 in substitute for the buffer current control circuit 110 (FIG. 1), and comprising a voltage follower circuit 153 which enables the phase compensation capacitor to be variable.

Figure 12:
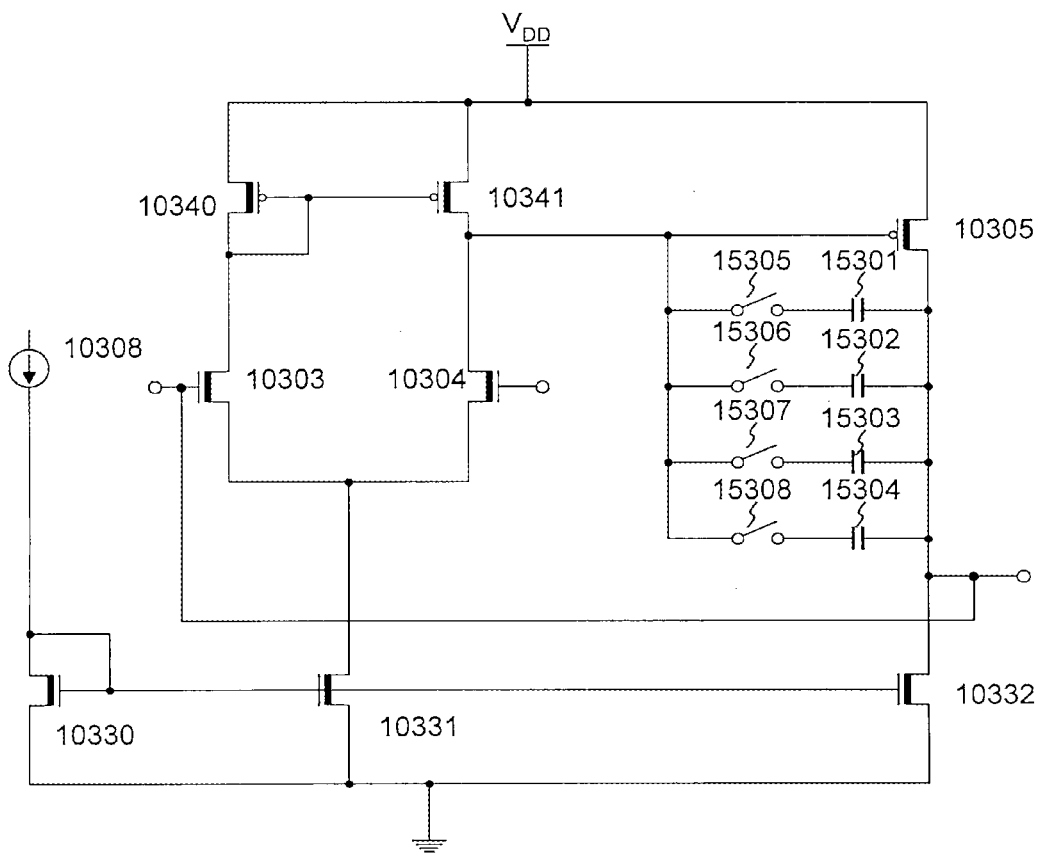
FIG. 12 is a circuit diagram showing the voltage follower circuit of the high frequency module according to Embodiment 2.

FIG. 12 shows a circuit of the voltage follower circuit 153. In FIG. 12 also, the components that are the same as those depicted in FIG. 3 are given the same reference numeral, and the explanation thereof is omitted. FIG. 12 differs from FIG.

3 with respect to the point of comprising a plurality of phase compensation capacitors 15301, 15302, 15303 and 15304 and capacitor selection switches 15305, 15306, 15307 and 15308 in substitute for the phase compensation capacitor 10306 (FIG. 3).

Upon causing the voltage follower circuit to function as a variable impedance circuit (buffer circuit), as can be understood from Formula (7) above, the frequency characteristics of the buffer circuit can also be changed by changing the values of the phase compensation capacitors. The respective values of the phase compensation capacitors 15301, 15302, 15303 and 15304 are set forth in advance based on circuit simulation or experimentation so that the impedance matching described above is not performed in their respective frequency bandwidths of the communication signals. The buffer capacitor control circuit 150 receives bandwidth data from the frequency band selection circuit 201, switches the capacitor selection switches 15305, 15306, 15307 and 15308 according to the selected bandwidth, and switches the phase compensation capacitors 15301, 15302, 15303 and 15304 to be used.

According to this embodiment, since the impedance of the variable impedance circuit is changed by switching the phase compensation capacitors, an increase in electric power consumption can be prevented.

Needless to say, the high frequency module of this embodiment may be applied to the portable terminal depicted in FIG. 8 and FIG. 9.

Moreover, while this embodiment explained a case of using a MOS transistor, a bipolar transistor may also be used.

While the invention was specifically explained above based on embodiments, the present invention is not limited to the foregoing embodiments, and it goes without saying that the present invention may be variously modified while remaining within the scope of the present invention.

10 High frequency module
20 Amplifier circuit
30 Bias circuit
40 Variable impedance circuit
103 Voltage follower circuit
106 Amplification transistor
109 Output matching network
110 Buffer current control circuit
201 Frequency band selection circuit

We claim:
1. A high frequency module, comprising:
an amplifier circuit including an output terminal, an amplification transistor connected to the output terminal and configured to amplify a high frequency signal and output the amplified high frequency signal to the output terminal, and a variable impedance circuit connected to the amplification transistor and configured to set an output impedance in the output terminal according to a control signal corresponding to a frequency bandwidth of the high frequency signal; and
a matching network connected to the output terminal of the amplifier circuit.
2. The high frequency module according to claim 1, further comprising:
a bias circuit configured to form a bias voltage to be supplied to the amplification transistor,
wherein the variable impedance circuit includes a voltage follower circuit configured to supply the bias voltage to the amplification transistor and in which frequency characteristics thereof change according to the control signal.

3. The high frequency module according to claim 2,
wherein the voltage follower circuit includes a pair of differential amplification transistors, one of which is configured to receive the bias voltage and the other of which is configured to receive an output of the voltage follower circuit, and a current circuit configured to supply a current according to the control signal as an operating current of the differential amplification transistor.
4. The high frequency module according to claim 3,
wherein the amplifier circuit includes a capacitor configured to receive the high frequency signal, and supply a high frequency signal to the amplification transistor.
5. The high frequency module according to claim 4,
wherein the high frequency signal is a signal transmitted according to a Long Term Evolution (LTE) standard.
6. The high frequency module according to claim 2,
wherein the voltage follower circuit includes a pair of differential amplification transistors, one of which is configured to receive the bias voltage and the other one of which is configured to receive an output of the voltage follower circuit, an output transistor configured to receive an output of the differential amplification transistor, and a plurality of feedback capacitors provided between an output and an input of the output transistor, and
wherein the plurality of feedback capacitors are connected selectively between the input and the output of the output transistor according to the control signal.
7. The high frequency module according to claim 6,
wherein the amplifier circuit includes a capacitor configured to receive the high frequency signal, and supply a high frequency signal to the amplification transistor.
8. The high frequency module according to claim 7,
wherein the high frequency signal is a signal transmitted according to a Long Term Evolution (LTE) standard.
9. A portable terminal, comprising:
an antenna;
a circuit configured to form a signal to be transmitted via the antenna;
a selection circuit configured to output a selection signal representing a frequency bandwidth to be used for transmission; and
a high frequency module including an amplifier circuit and a matching network,
wherein the amplifier circuit includes:
an amplification transistor configured to amplify a high frequency signal according to the signal to be transmitted and output the amplified high frequency signal to the output terminal; and
a variable impedance circuit connected to the amplification transistor and configured to set an output impedance in the output terminal according to a selection signal from the selection circuit,
wherein the matching network is connected between an output terminal of the amplifier circuit and the antenna.
10. The portable terminal according to claim 9, further comprising:
a bias circuit configured to form a bias voltage to be supplied to the amplification transistor,
wherein the variable impedance circuit includes a voltage follower circuit configured to supply the bias voltage to the amplification transistor and in which frequency characteristics thereof change according to the selection signal.
11. The portable terminal according to claim 10,
wherein the high frequency signal is transmitted according to a Long Term Evolution (LTE) standard.

12. The portable terminal according to claim 10,
wherein the bias circuit and the amplification transistor and the variable impedance circuit are formed on one semiconductor chip.

13. A high frequency module, comprising:
a bias circuit configured to form a bias voltage;
an amplification transistor configured to amplify a high frequency signal;
a voltage follower circuit in which the input thereof is connected to the bias circuit and the output thereof is connected to the amplification transistor; and
a capacitor connected to the amplification transistor and configured to supply the high frequency signal to the amplification transistor.

14. The high frequency module according to claim 13, further comprising:
a resistor connected between an output of the voltage follower circuit and the amplification transistor.

15. The high frequency module according to claim 14,
wherein the bias circuit, the voltage follower circuit, and the amplification transistor are formed on one semiconductor chip.

16. The high frequency module according to claim 14,
wherein the bias circuit, the voltage follower circuit, and the amplification transistor are formed on one semiconductor chip.

17. The high frequency module according to claim 15,
wherein the bias circuit includes a transistor and a constant current source.

18. The high frequency module according to claim 17,
wherein the amplification transistor is a field effect-type transistor.

19. The high frequency module according to claim 16,
wherein the bias circuit includes a transistor and a constant current source.

20. The high frequency module according to claim 19,
wherein the amplification transistor is a field effect-type transistor.

* * * * *